United States Patent [19]

Morris

[11] Patent Number: 4,754,169
[45] Date of Patent: Jun. 28, 1988

[54] DIFFERENTIAL CIRCUIT WITH CONTROLLABLE OFFSET

[75] Inventor: Bernard L. Morris, Allentown, Pa.

[73] Assignee: American Telephone and Telegraph Company, AT&T Bell Laboratories, Murray Hill, N.J.

[21] Appl. No.: 42,396

[22] Filed: Apr. 24, 1987

[51] Int. Cl.[4] .......................... H03K 5/22; H03F 3/45
[52] U.S. Cl. .................................... 307/355; 330/253
[58] Field of Search .............. 307/355, 362, 490, 491, 307/497; 330/252, 253, 257, 310, 311

[56] References Cited

U.S. PATENT DOCUMENTS 4,464,631  8/1984  Prentice ............................. 330/253

Primary Examiner—Eugene R. LaRoche
Assistant Examiner—Steven J. Mottola
Attorney, Agent, or Firm—James H. Fox

[57] ABSTRACT

In various analog applications, it is desirable to have a known offset voltage at the input of a comparator, operational amplifier, or other type of differential stage. For example, in an ISDN receiver, the use of a desired offset allows for discriminating between signals having different amplitudes. In the present technique, a reference current, derived from a reference voltage ($V_{ref}$) and on-chip resistor (R1) is used to set the currents through two input transistors, typically MOS transistors. An offset resistor (R0) in the source lead of one of the transistors produces a voltage drop that sets the offset at an input of the differential stage. The voltage drop across R0 is proportional to ($V_{ref} \times R0$)/R1. Since R0 and R1 are fabricated by the same process, their ratio is independent of temperature, process, etc. Therefore, a well-defined offset is obtained.

5 Claims, 2 Drawing Sheets

REFERENCE CURRENT SOURCE

DIFFERENTIAL CIRCUIT WITH CONTROLLABLE OFFSET

BACKGROUND OF THE INVENTION

1. Field of the Invention

The present invention relates to an integrated circuit technique for producing a desired offset voltage at the input of a circuit.

2. Description of the Prior Art

Many analog circuits, including comparators and operational amplifiers, are characterized in part by the input offset voltage specification. This provides a measure of how much the voltage on one input terminal must differ from the voltage on another input terminal in order to drive the output to the midpoint in its range. Normally, offsets are desirably as small as possible, and typically range from a few millivolts down to a few microvolts, or even less, in current bipolar and MOS integrated circuits. Since a non-zero offset is typically undesirable, steps are usually taken to minimize the offset. These include careful matching of transistor sizes, and elaborate voltage or current sensing for providing a feedback signal that cancels the offset voltage. However, in some cases, a controllable non-zero offset is desired. For example, a threshold may be desired for discriminating against signals below a certain magnitude. Multiple-thresholds may be desired, as is the case in analog-to-digital converters, where analog signals are quantized. In these and other cases, a resistor divider network is usually used to provide the offset, by dividing the input voltage a desired amount. However, a resistor divider network loads down the input to some extent, which is undesirable in some applications. One application where loading is undesirable is in the receiver portion of an Integrated Services Digital Network (ISDN) transceiver. In that case, a balanced bus is used for transmission among several users, which may vary in number from 1 to 8. It is undesirable to change the loading on the bus as different numbers of users connect to the bus, while at the same time providing a receiver that has a threshold to reject noise voltages below a given value.

It is also known in the art to provide DC level shifting at the input of a differential stage (e.g., an operational amplifier), by the use of source-follower input transistors in the case of field effect transistors, or emitter-follower input transistors in the case of bipolar transistors. In those cases, the input signal is coupled to the control electrodes (gates or bases, respectively), whereas controlled electrodes (sources or emitters, respectively) are connected to the differential inputs. Current sources flow current through the source paths or emitter paths, respectively. However, a typical goal of such designs is again to minimize the offset between the inputs of the differential stage.

SUMMARY OF THE INVENTION

I have invented a technique for producing a desired offset voltage at the input of a circuit. A pair of input transistors are connected to current sources that mirror a reference current derived from a reference voltage applied across a reference resistor. A voltage drop resistor in the output path of one of the input transistors creates the desired offset voltage. By forming all the elements on the same integrated circuit, the offset voltage is independent of all factors except the reference voltage.

DETAILED DESCRIPTION

Figure 1:
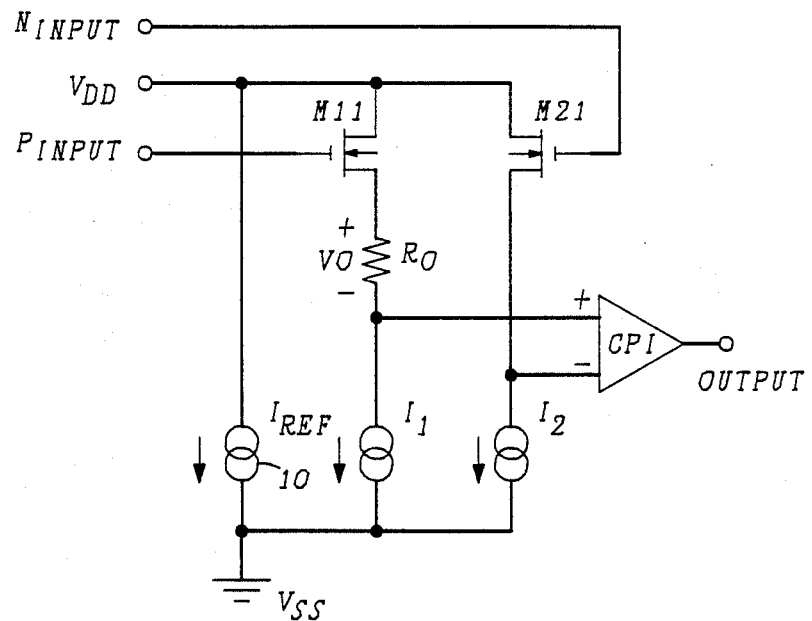
FIG. 1 illustrates an embodiment of the present invention using field effect input transistors.

The following detailed description relates to an improved technique for generating a desired offset voltage, for use in a variety of integrated circuit applications. While the exemplary embodiments utilize field effect transistor technology and devices, bipolar technology and devices are possible, as is a combination of the two. Referring to FIG. 1, input transistors M11 and M12 receive inputs P and N at their gates, and have their sources coupled to the non-inverting (+) and inverting (−) inputs of circuit CP1, respectively. Circuit CP1 is typically a comparator, but may alternately be an operational amplifier or other circuit having non-inverting and inverting inputs, and high input impedance. The source of M11 is connected through offset resistor RO to the non-inverting input of CP1. A reference current $I_{ref}$ is generated by a source 10. The reference current is mirrored by current sources $I_1$ and $I_2$, which cause identical currents to flow through the channels of input transistors M11 and M12. As explained below, $I_{ref}$ is preferably generated from a reference voltage applied across a resistor R1 on the same integrated circuit as the offset resistor RO, such that $I_{ref} = V_{ref}/R1$. Since CP1 has a high input impedance, approximately all of $I_1$ flows through RO, generating an input offset voltage VO, where $VO = I_1 \times RO = V_{ref}(RO/R1)$. Therefore, assuming that CP1 itself has a zero offset voltage, and that the threshold voltages of M11 and M12 are equal, the input P must become VO more positive than the input N before the comparator CP1 responds; i.e., the input P is offset by voltage VO from the input N. The resistor RO may alternately be placed in the source path of M12, in which case a negative offset voltage ($-I_2 \times RO$) will be obtained.

Figure 2:
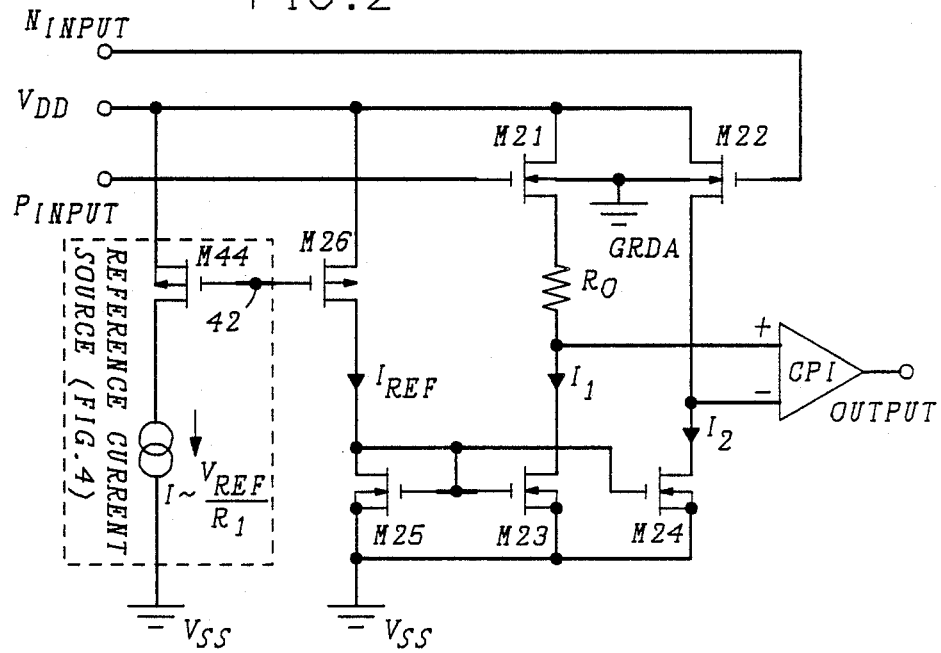
FIG. 2 illustrates an embodiment of the present invention using n-channel field effect input transistors.

Referring to FIG. 2, an implementation of the present technique using n-channel input transistors (M21, M22) is shown. This may be accomplished in CMOS technology, wherein the n-channel transistors M21 ... M25 may be formed directly in a p-type substrate or epitaxial layer, and the p-channel transistor M26 formed in an n-type tub. The current sources $I_1$ and $I_2$ are implemented using transistors M23 and M24, respectively, which mirror the current $I_{ref}$ flowing through M25 and M26. The current $I_{ref}$ is controlled by the gate voltage on M26, discussed below. If the sizes of M23 and M24 are equal, the currents $I_1$ and $I_2$ will be equal. However, this need not be the case; it is merely necessary that these currents be proportional, which may be obtained by appropriate sizing of M23 and M24. Furthermore, the current mirror configuration shown ensures that $I_1$ and $I_2$ are proportional to $I_{ref}$, but need not equal it. For example, in one iplementation, the channel width of M25 is 10 mircrometers, whereas the channel widths of M23 and M24 are 50 micrometers, with a channel length of 10 micrometers in each case. Therefore, with a nominal reference current $I_{ref}$ of 20 microamps, the currents $I_1$ and $I_2$ are five times as great, being 100 microamps each. The offset voltage (VO) is somewhat greater than that calculated above, due to the increase in the back-gate bias of M21. For example, with RO=2550 ohms, the voltage across RO is 0.255 volts. However, this voltage raises the source of M21 above the source of M22 by this amount. This changes the backgate bias of M21, which in turn increases the voltage required to turn on M21 by about 57 millivolts in the exemplary case. Therefore, the actual value of the offset voltage VO is 0.255+0.057=0.312 volts.

Figure 3:
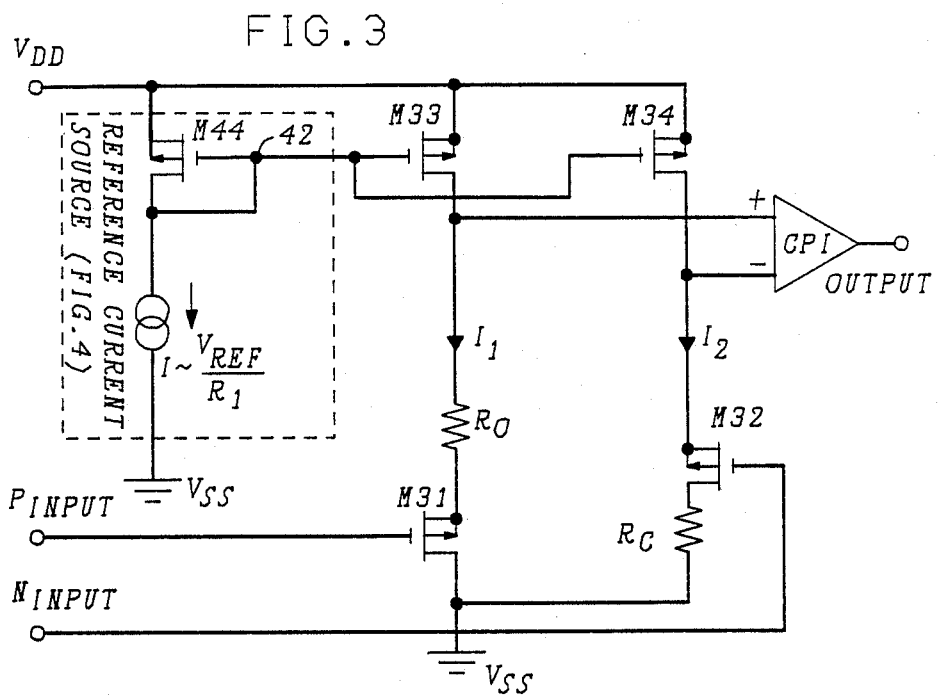
FIG. 3 illustrates an embodiment of the present invention using p-channel field effect input transistors.

Referring to FIG. 3, an embodiment using p-channel input transistors is shown. If a p-type substrate is used, as above, the p-channel transistors may be formed in isolated n-regions (i.e., tubs). This allows the input transistors M31 and M32 to be formed in separate n-tubs. This has the advantage of allowing the source of each input transistors to be connected to the n-type region in which it is formed, thereby eliminating the back-gate bias influence on the offset voltage. (Of course, this advantage may alternately be obtained using n-channel input transistors formed in isolated p-tubs in an n-type substrate.) In the illustrative case, the sizes of M33 and M34 are chosen to provide currents of 50 microamps through M31 and M32. Therefore, the offset voltage is 160 millivolts, due to the drop across the 3200 ohm resistor connected to the source of M31. Note also that an optional compensation resistor, RC, is included in the drain of M32. By choosing RC to have the same value as RO (i.e., 3200 ohms in this case), the current $I_2$ is made more nearly equal to $I_1$, and therefore the offset voltage is made more predictable.

Figure 4:
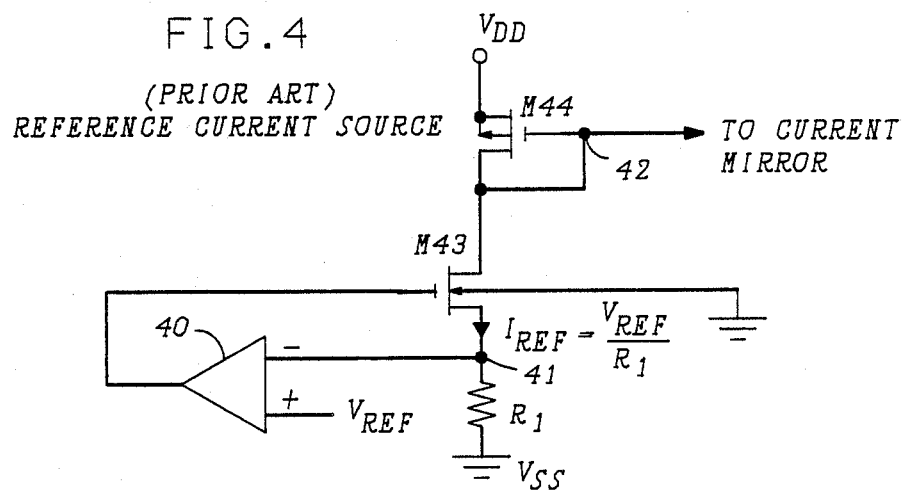
FIG. 4 illustrates a prior art current source suitable for generating the reference current.

The currents $I_1$ and $I_2$ mirror the reference current, $I_{ref}$, as noted above. The reference current is preferably derived from a reference resistor (e.g., R1 of FIG. 4) formed on the same integrated circuit, and by the same process, as the offset resistor RO. For example, both may be formed in the same diffusion operation, or both may be doped polysilicon resistors, etc., so that the current through the offset resistor tracks the changes in the reference current due to processing and temperature variations. Referring to FIG. 4, a known type of current source suitable for use in the present technique is shown, with other types being possible. A reference voltage $V_{ref}$ is applied to the positive (non-inverting) input of operational amplifier 40. The negative (inverting) input is coupled to ground through resistor R1. The operational amplifier 40 controls the voltage on the gate of transistor M43. This ensures that node 41 is maintained equal to $V_{ref}$, so that the current through R1 is equal to $V_{ref}$/R1. Therefore, the voltage on output node 42 is such as to produce the reference current $I_{ref}$ through transistor M44, and hence through any transistor that mirrors M44 in the well-known current mirror configuration. As above, the mirror current need not equal $I_{ref}$, as in the illustrative case, but merely be proportional to it, as may be obtained by the appropriate choice of transistor sizes.

Note that the foregoing has assumed that only a single offset resistor is present, which may be in either one of the current paths through the input transistors depending on whether a positive or negative offset voltage is desired. However, it is alternately possible to use resistors of different values in both current paths. The offset voltage will then be due to the difference in voltage drops across the resistors. In still another alternative, equal value resistors may be used, but with the currents ($I_1, I_2$) through the input transistors being unequal. The offset voltage is then due to the difference in the currents. In either case, the "offset resistor" referred to herein is then the resistor across which the greatest voltage drop occurs. In typical applications, an offset voltage of at least 10 millivolts, and typically at least 100 millivolts is desired, which may readily be obtained by the present technique.

Although the use of field effect input transistors is shown above, bipolar transistors may alternately be used as the input transistors. In that case, the input signals are coupled to the base electrodes, and the offset resistor placed in the emitter lead of the desired input transistor. The collectors of the input transistors are then connected to the appropriate power supply voltage. The current source and mirror transistors may also be of the bipolar type.

What is claimed is:

1. An integrated circuit comprising a differential stage having inverting and non-inverting inputs, and first and second input transistors each having a controlled electrode coupled to said inputs, respectively, and first and second current sources coupled to flow current through said input transistors, characterized in that said integrated circuit further comprises an offset resistor connected between the controlled electrode of one of said input transistors and the associated input of said differential stage, wherein the current flow through said offset resistor produces a desired offset voltage, and wherein said first and second current sources mirror a reference current derived by applying a reference voltage across a resistor formed in the same process that forms said offset resistor.

2. The integrated circuit of claim 1 wherein said input transistors are field effect transistors.

3. The integrated circuit of claim 1 further comprising a compensation resistor connected between a controlled electrode of the other of said input transistors and a power supply voltage node.

4. The integrated circuit of claim 1 wherein said offset voltage is at least 10 millivolts.

5. The integrated circuit of claim 1 wherein said offset voltage is at least 100 millivolts.

* * * * *